United States Patent [19]

Gupta et al.

[11] Patent Number: 4,904,528
[45] Date of Patent: Feb. 27, 1990

[54] COATED GAS TURBINE ENGINE COMPRESSOR COMPONENTS

[75] Inventors: Dinesh K. Gupta, Vernon; Melvin Freling, West Hartford, both of Conn.

[73] Assignee: United Technologies Corporation, Hartford, Conn.

[21] Appl. No.: 137,852

[22] Filed: Dec. 24, 1987

[51] Int. Cl.$^4$ .............................................. B32B 15/04
[52] U.S. Cl. .................................... 428/336; 428/457; 428/627; 428/628; 428/698; 427/37; 204/192.38
[58] Field of Search ............... 428/627, 628, 660, 457, 428/698, 336; 427/37; 204/192.38; 75/244

[56] References Cited

U.S. PATENT DOCUMENTS

| | | |
|---|---|---|
| 3,332,870 | 7/1967 | Orbach et al. ................... 204/164 |
| 3,451,772 | 6/1969 | McCabe et al. .................. 423/411 |
| 3,656,995 | 4/1972 | Reedy, Jr. ....................... 427/255.2 |
| 3,784,402 | 1/1974 | Reedy, Jr. ....................... 428/457 |
| 3,848,068 | 11/1974 | Rice ................................ 423/335 |
| 4,080,431 | 3/1978 | Moss ................................ 423/289 |
| 4,337,300 | 6/1982 | Itaba et al. ...................... 428/660 |
| 4,492,522 | 1/1985 | Rossmann et al. ............... 416/241 R |

FOREIGN PATENT DOCUMENTS

| | | |
|---|---|---|
| 87/02071 | 4/1987 | World Int. Prop. O. . |
| 87/02072 | 4/1987 | World Int. Prop. O. . |

OTHER PUBLICATIONS

Chemical Abstracts, V105, 1986 83451h.
Chemical Abstracts, V96, 1982, 222019j.

Primary Examiner—L. Dewayne Rutledge
Assistant Examiner—George Wyszomierski
Attorney, Agent, or Firm—Charles E. Sohl

[57] ABSTRACT

Coated gas turbine engine hardware is described. The hardware comprises a titanium alloy substrate having a coating thereon consisting essentially of titanium nitride wherein the ratio of nitrogen to titanium is greater than one. Such coatings have a residual compressive stress state which aids in minimizing the fatigue debit which would otherwise result from the use of a hard coating on a titanium substrate. Coatings are applied by the use of a vacuum arc deposition process.

5 Claims, 3 Drawing Sheets

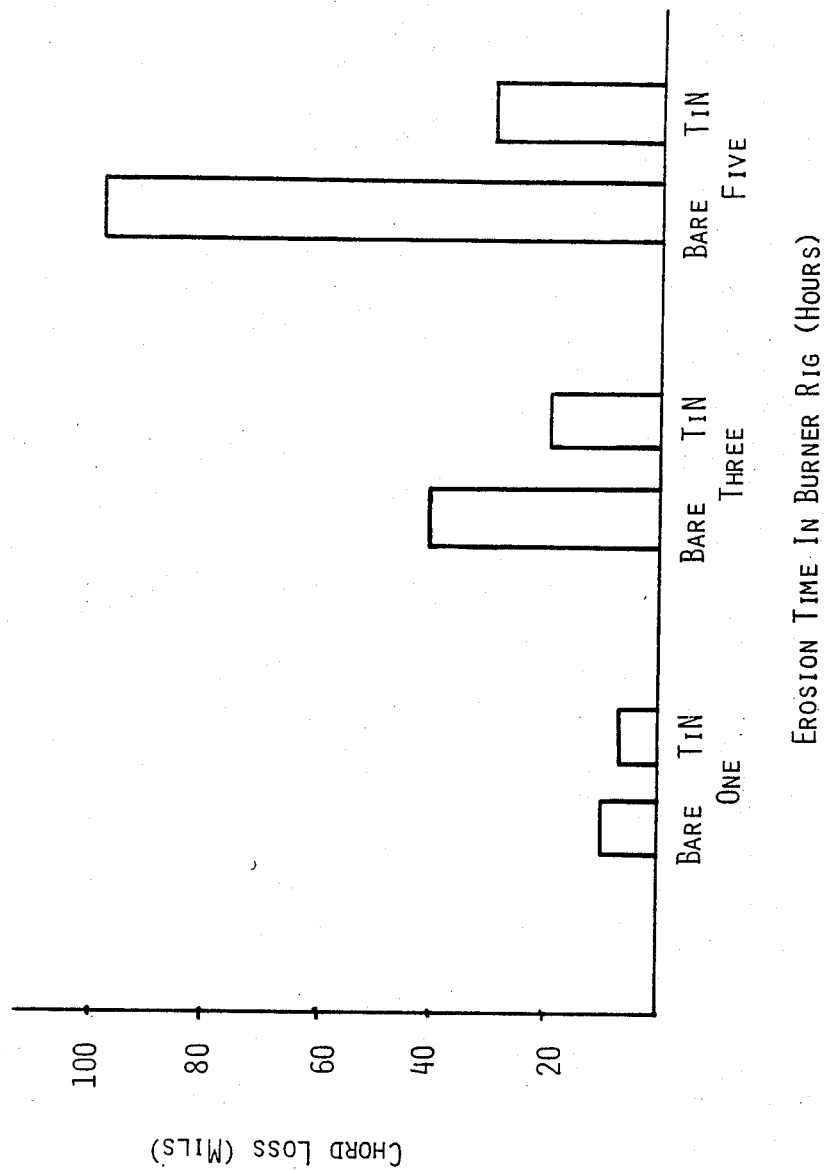

COATED GAS TURBINE ENGINE COMPRESSOR COMPONENTS

TECHNICAL FIELD

This invention relates to coatings from protecting titanium alloy gas turbine engine components. More particularly this invention relates to titanium nitride coatings which provide erosion resistance with no significant debit to fatigue properties.

BACKGROUND ART

Because of their mechanical properties titanium alloys are widely, if not exclusively, used in the fabrication of compressor hardware for gas turbine engines. Such hardware includes blades and vanes which cooperate to compress air which is subsequently combusted with the addition of hydrocarbon fuel to provide motive power. Gas turbine engine compressors generally comprise a multiplicity of sets of blades and vanes which cooperate to progressively compress air. The number of stages may range from about 5 to about 20. In a modern gas turbine engine the compressed air may reach temperature of up to 1400° F., pressures of up to 450 psi and velocities of up to 1000 ft. per minute. Thus, it can be appreciated that compressor hardware, especially towards the end of the compression process operates in a demanding environment.

Efficient compressor operation demands the maintenance of the original compressor hardware geometry. The compressor blades and vanes have airfoil shapes with relatively sharp edges. Gas turbine engines ingest vast quantities of air and this air will inevitably include some amount of particulate material. In the case of aircraft this may be sand or grit from the runway. Such materials are very abrasive and erosive when they impact compressor hardware at high speeds. The erosion process is detrimental as it reduces the compressor efficiency because of the degradation of the starting airfoil geometry.

This problem has been appreciated for some time and attempts have been made to employ hard coatings on compressor hardware surfaces to reduce erosion. Such coatings are generally more or less effective in controlling erosion but they have all heretofore had a significant detrimental effect on the high cycle fatigue behavior.

Compressor blades and vanes operate in a high energy moving gas stream and are subject to a variety of vibrational effects. Due to these conditions and the inherent properties of titanium, many compressor components have lives which are fatigue limited. Thus any detriment in fatigue life resulting from a hard coating cannot be tolerated.

Therefore, a need exists for an erosion resistant coating which does not reduce the fatigue properties of gas turbine components.

DISCLOSURE OF INVENTION

In its broadest terms the present invention comprises a titanium nitride (TiN) coating securely bonded to a titanium alloy substrate wherein the coating has a substantial residual compressive surface stress. We have found that residual coating compressive stresses within a certain range are effective to essentially eliminate the detriment on fatigue properties which has previously been observed with such coatings.

Titanium nitride is the preferred coating composition. Compressive residual stresses in the coating result from an excess of nitrogen. Such an excess of nitrogen, which is present as an interstitial element, strains the titanium nitride lattice and produces a residual compressive stress.

Such a coating can be applied using a reactive arc vapor deposition process. Such a process employs an electric arc to generate a plasma in a reduced pressure of nitrogen gas. The arc is struck from a titanium cathode and produces a plasma cloud which includes ionized nitrogen and vaporized titanium which is likely also ionized. These constituents combine to form a titanium nitride coating on an adjacent substrate, which can be suitably electrically biased to provide enhanced coating deposition. When performed under proper conditions the ratio of nitrogen to titanium in the coatings of the invention will range from about 1.05 to about 1.15. Such nitrogen excesses are obtained when the coatings have been built up for long periods of time, that is to say, such nitrogen excesses are observed in thick coatings. Such excess nitrogen present in coating thicknesses from about 10 to about 25 microns will produce a residual compressive stress of at least 100 ksi and preferably about 100 to about 150 ksi. Such a coating residual stress will exceed the surface residual stress normally present in an uncoated titanium component and will therefore assist in retarding crack initiation and growth. In the following description and claims all stresses are measured at room temperature. Also, reference to titanium is meant to include titanium alloys where the titanium content exceeds 50 atomic %. Preferred alloying elements include the refractory metals such as zirconium, hafnium, molybdenum, tantalum, columbium, vanadium, chromium, tungsten, rhenium and the like.

The foregoing and other features and advantages of the present invention will become more apparent from the following description and accompanying drawing.

BRIEF DESCRIPTION OF DRAWINGS

FIG. 3 shows the effect of the invention coating on erosion performance.

BEST MODE FOR CARRYING OUT THE INVENTION

Figure 1:
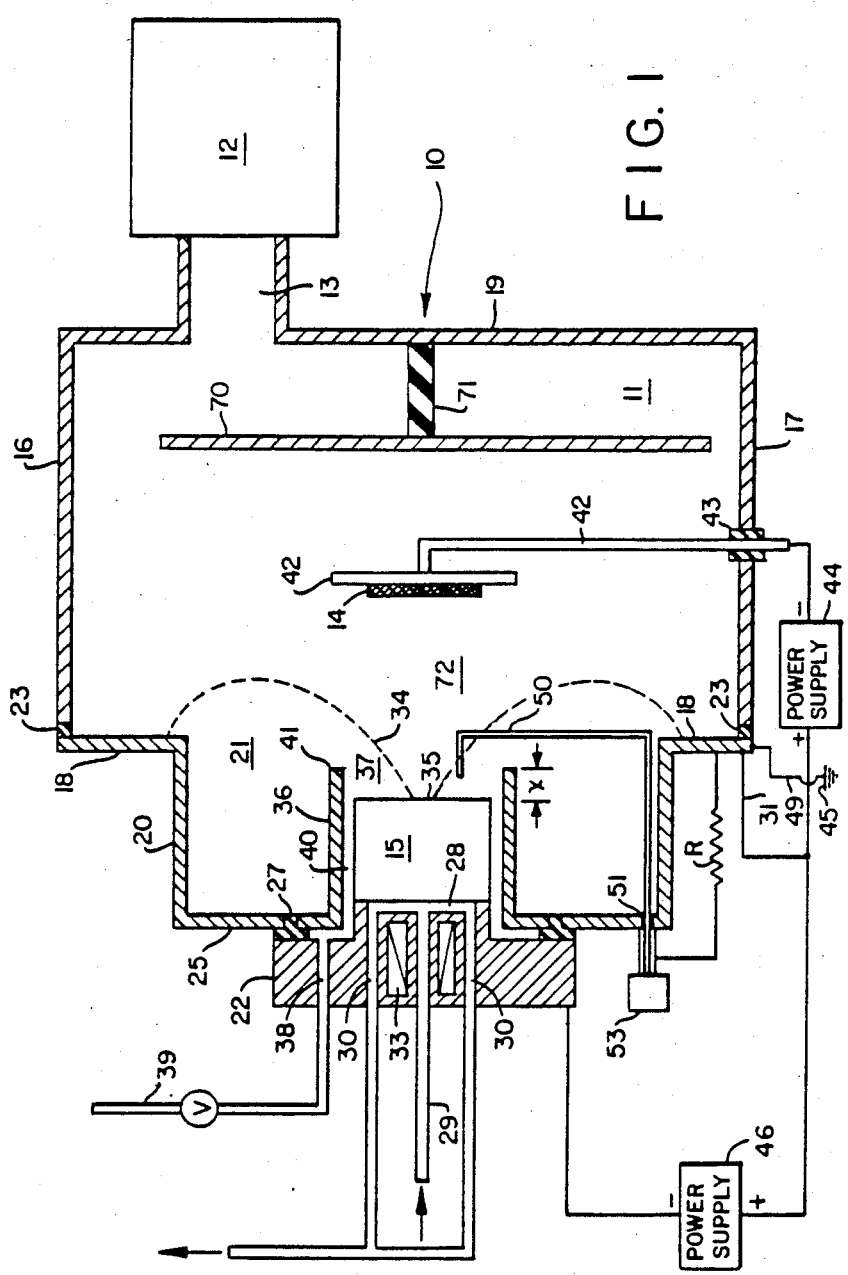
FIG. 1 shows an apparatus suited for application of invention coatings.

The coatings of the invention can be produced using an apparatus which is shown in schematic form in FIG. 1. More specific details on the apparatus are found in international applications published under the Patent Cooperation Treaty on Apr. 9, 1987, publication numbers WO87/02071 and WO87/02072. The contents of these application are incorporated herein by reference. The invention concerns certain stressed coatings made using the apparatus but the apparatus is not a part of the present invention.

Now with reference to FIG. 1, the apparatus for practicing the method of the present invention comprises a shell 10 having a vacuum chamber 11 which is evacuated to a desired operating pressure of generally between $10^{-1}$ to $5 \times 10^{-4}$ torr and preferably between $5 \times 10^{-2}$ and $5 \times 10^{-3}$ torr by a conventional vacuum pumping system 12 communicating with the vacuum chamber 11 through an open port 13.

The vacuum chamber 11 may have any desired geometry and be of any desired size to accommodate one or more objects 14 to be coated with source material provided by evaporating one or more solid titanium cathodes 15 in accordance with the practice of the present invention. For illustrative purposes, the shell 10 is shown having a generally rectangular body which, in cross section, has an upper wall 16, a lower wall 17, and side walls 18 and 19, respectively. The shell 10 can include an additional section 20 which projects an arbitrary distance from the side wall 18. The side wall 18 has an opening 21 through which the titanium cathode 15 communicates with the vacuum chamber 11.

The titanium cathode 15 is attached to a cathode support assembly 22. The cathode support assembly 22 is mounted on a flange 25 through an insulator 27. The mounting flange 25 is connected to section 20 of the shell 10. The support block 22 has a relatively small cavity 28 connected to an inlet passage 29 and to exit passages 30. A coolant such as water is circulated through the cavity 28 from a source (not shown). The coolant flows from the source through the inlet passage 29 into the cavity 28 and returns to the source through the exit passages 30. A DC magnet 33 is disposed within the support block 22 and serves to diffuse the point of attachment of an electric arc 34 over the arc evaporation surface 35 of the cathode 15.

A hollow elongated member 36 surrounds and is spaced from the titanium cathode 15 to form a relatively narrow space 40. The elongated member 36 is attached to the mounting flange 25 through the insulator 27. The geometry of the member 36 and open end 41 preferably substantially conforms to the geometry and dimension of the titanium cathode 15 as shown in FIGS. 3A, 3B and 3C, respectively. The elongated member 36 should be substantially uniform in cross-sectional dimension over its length. This assures that the open end 41 does not restrict the plasma flow as it exits member 36. Accordingly, if a cylindrical or disk shaped titanium cathode is used, the member 36 should preferably be tubular in shape with the narrow space 40 being annular in cross section. For a 6.35 cm diameter cathode the thickness of the annular space 40 can range from about 0.08 cm to about 0.24 cm. An inlet opening 38 in the support block 22 directly communicates with the narrow space 40 and with an input nitrogen gas supply line 39. Nitrogen gas is fed through the nitrogen gas supply line 39 from a source of nitrogen gas (not shown) into the narrow space 40 from whence the gas is directed through the cathode chamber 37 into the vacuum chamber 11. A valve V is used to control the flow of nitrogen gas through the supply line 39.

The elongated member 36 projects a predetermined distance "x" beyond the cathode evaporable end surface 35 to form a cathode chamber 37. The extension "x" between the open end 41 of the member 36 and the evaporable end surface 35 must be above zero and up to a maximum of, for example, about 13 cm in length for a 6.35 cm diameter cathode 15. The distance "x" is measured from the cathode evaporable end surface 35 as shown in FIG. 3 to the open end 41 of the elongated member 36. The preferred minimum distance "x" is at least about one centimeter and the preferred range for "x" is between 2 to 6 cm for a 6.35 cm diameter cathode. Similar aspect ratios of "x", herein defined as x/d where "d" is the major dimension of the cathode evaporable end surface 35, must be maintained for all cathode geometries. The aspect ratio must be above zero and up to a maximum of about 2.0. The preferred minimum aspect ratio is at least about 0.07 and the preferred range of the aspect ratio is between 0.3 and 1.0. The critical requirement and importance of recessing the cathode 15 within the member 36 to form cathode chamber 37 will be discussed at greater length later in the specification. The elongated member 36 may preferably be composed of any material that does not interfere with the function of magnet 33 in diffusing the attachment of electric arc 34 over the arc evaporation surface 35 and can comprise any nonmagnetic material suitable for high temperature vacuum service, e.g., nonmagnetic stainless steel.

The object 14 is mounted upon a support plate 42 located within the vacuum chamber 11 and spaced apart from the evaporable end surface 35 of the titanium cathode 15. The type of structure used to support or suspend the object 14 within the vacuum chamber 11 depends upon the size, configuration and weight of the object. For simplicity, the object 14 is shown having a rectangular geometry with a flat surface facing the cathode evaporation end surface 35. It should be understood that the object 14 may have any configuration and may be supported in any fashion. The object 14 may also be of any suitable composition capable of withstanding the high temperature, vacuum conditions existing in the chamber 11 and can be made of such materials as refractory metals, superalloys, stainless steels, ceramic composites and titanium alloys. The support plate 42 should, however, be composed of a conductive material and is connected to a metal rod 42 which extends through an insulated high voltage feed-through port 43 in the lower wall 17 of the shell 10. The metal rod 42 is connected to the negative terminal of a bias power supply 44 located external of the shell 10 with the positive terminal of the bias power supply 44 connected to the side wall 18 through the electrical lead 31.

The vacuum chamber 11 further can include an electrically insulated surface 70 located opposite the cathode evaporable end surface 35 with the object 14 and support plate 42 positioned therebetween. The electrically insulated surface 70 can be itself comprised of an insulator material or can be comprised of a conductive material which is insulated from the chamber 10 by insulator 71 shown. This electrically insulated surface 70 serves to substantially confine the plasma to the chamber volume 72 between surface 70 and cathode evaporable end surface 35 wherein the object 14 is located without surface 70 attracting ions or electrons from the plasma and further serves to prevent interaction between plasmas when multiple evaporators are accommodated in chamber 11.

Arc current is supplied from a main power supply 46 located external of the shell 10. The main power supply 46 has its negative terminal connected to the cathode support block 22 and its positive terminal connected to the side wall 18. The electric arc 34 is formed between the titanium cathode 15 and the side wall 18 of the shell 10. The side wall 18 represents the anode and can be connected to ground potential 45 through an electrical lead 49. Alternatively, the anode may be formed from another conductive member (not shown) mounted adjacent to but electrically separated from the side wall. The geometry of such anode would not be critical. In the latter case, the arc conduit can be electrically isolated from the shell 10. It is also obvious that the side wall 18 can be electrically insulated from the other walls of the shell 10 by using insulating separators such as those shown at 23. It is also obvious that the anode side wall 18 can be free-floating with the ground at removed and the shell wall 16, 17, and 18 grounded.

Any conventional arc starting procedure may be used including physically contacting the titanium cathode end surface 35 with a wire electrode 50. The wire electrode 50 is electrically connected to anode side wall 18 or a separate anode (not shown) through a high resistance R. In addition, the wire electrode 50 is connected to a plunger assembly 53 through an insulated sleeve 51 in the mounting flange 25. The plunger assembly 53 moves the wire electrode into physical contact with the cathode end surface 35 and then retracts it. A conventional plunger assembly for performing this operation is taught and described in U.S. Pat. No. 4,448,799. However, any mechanism capable of moving the starting wire electrode 50 into contact with the cathode 15 and withdrawing it may be used to practice the present invention. Alternatively, an arc may be started by other conventional methods including transferred arc starting and spark starting using a spark plug.

In touch starting, once contact is made between the starting wire electrode 50 and the cathode 15, current flows from the main power supply 46 through the cathode 15 and wire electrode 50 to anode side wall 18. Retraction of the wire electrode 50 breaks contact with the cathode 15 to form an electric arc. The high resistance R causes the arc to transfer to the anode side wall 18 which is a less resistive path than the path to the wire electrode 50.

The plasma produced by the high current density arc includes atoms, molecules, ionized atoms and ionized molecules of the titanium cathode evaporation surface 35 and ionized species of nitrogen gas. Biasing the object 14 negatively with respect to the anode 18 or to both the anode 18 and cathode 15 influences the smoothness, uniformity and surface morphology of the coating. The bias power supply should be adjusted to a bias potential to optimize the coating operation. For a TiN, coating a bias potential between 100 and 200 volts is preferred.

Nitrogen gas is fed through the space 40 into the cathode chamber 37 representing the volume of space between the cathode evaporation surface 35 and the open end 41 of the elongated member 36. The nitrogen gas envelops the high current density arc in the cathode chamber 37 over the distance "x" resulting in an increase of plasma pressure and temperature. The plasma extends from the cathode evaporation end surface 35 through the relatively high pressure region in the cathode chamber 37 and exits through the open end 41 of the elongated member 36 toward the relatively lower pressure region in the vacuum chamber 11, or chamber volume 72, where the negatively biased substrate is located. An additional benefit of feeding nitrogen gas through the narrow space 40 into cathode chamber 37 is that the nitrogen gas in space 40 serves an insulator to prevent arcing from the cathode 15 to the member 36.

Thus FIG. 1 shows the essentials of a reactive arc vapor deposition apparatus which can be used to apply a titanium nitride coating to a titanium substrate. But the apparatus shown in FIG. 1 can be used to apply a variety of titanium nitride coatings having different characteristics, the vast majority of which will be useless in gas turbine engine applications and most of which will in fact be detrimental in such applications. The developer of the apparatus worked with the present assignee in applying TiN coatings to compressor airfoils. The apparatus developers sought to use the thinnest possible coatings, 1 to 5 microns. It was only the present inventors who appreciated the significance of residual stresses in thick coatings.

Titanium compressor hardware conventionally is shot peened and has therefore a residual surface compressive stress of 50 to 100 ksi which helps to retard fatigue crack initiation and growth. Only coatings which have residual compressive stresses in excess of the preexisting surface residual stress will not reduce fatigue properties. Residual coating compressive stresses in excess of the preexisting surface compressive stresses and preferably greater than 100 ksi are desired. It is also desired that the coating residual stress exceed the inherent substrate residual stress by at least 10 ksi and preferably by at least 40 ksi.

Residual stresses are appropriately measured in coatings using x-ray diffraction techniques well known to those skilled in the art. All crystalline substances have characteristic atomic arrangements which include planes of atoms separated by regular and well defined spacings. When crystalline materials are strained, these characteristic interatomic planar spacings are changed. X-ray techniques are available for measuring these inter planar distances and for calculating the stress present in a particular specimen by measuring actual interplanar spacings and comparing these values with standard values from stress free samples.

In the present situation high residual compressive stresses are desired. Such residual stresses are found in titanium nitride coatings made according to the previously described process. Excess nitrogen present in interstitial lattice sites significantly distorts the coating lattice thus producing a compressive stress. As would be expected with more nitrogen present in the coating there is more residual compressive stress. More nitrogen can be diffused into the coating if the article is held at a high temperature for a long period of time during coating deposition. This is another way of saying that high residual compressive stresses are generally found in thick titanium nitride coatings.

Figure 2:
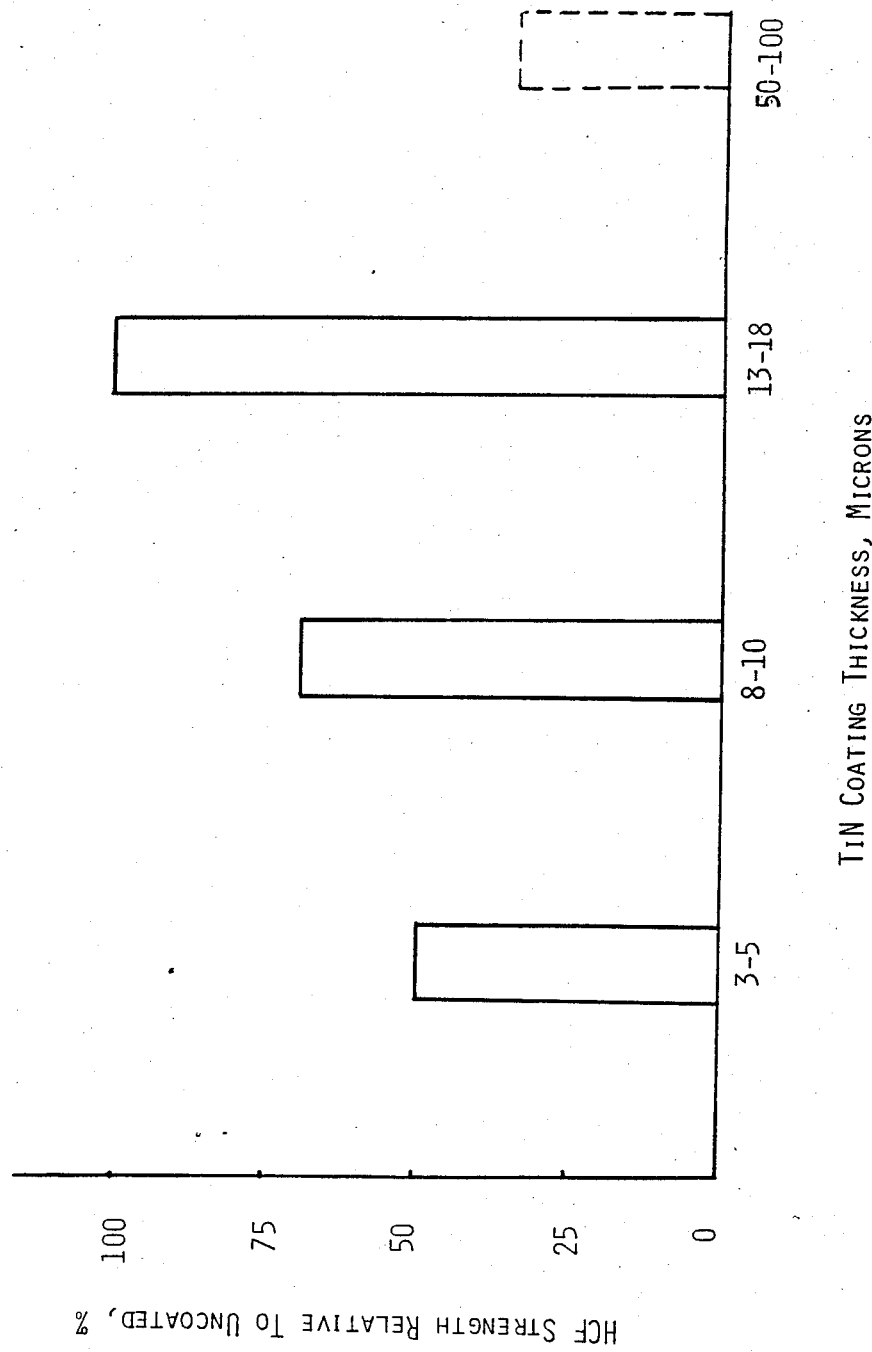
FIG. 2 shows the fatigue behavior resulting from different thickness coatings.

FIG. 2 shows the high cycle fatigue performance of various titanium substrates coated with different thicknesses of titanium nitride made according to the present invention. The vertical axis shows the high cycle fatigue performance of the coated article relative to that of an uncoated article It can be seen that for coatings ranging from about 13 to about 25 microns in thickness the high cycle fatigue performance is essentially equal to the uncoated sample. Thinner coatings displayed inferior high cycle fatigue performance and it is anticipated that similar decreases in high cycle fatigue performance will be observed for thicker coatings. Thin coatings do not have sufficient residual stress to resist fatigue. Thick coatings are anticipated to fail by spallation since in thick coatings the existing coating defects will cause failure remote from the coating substrate interface.

FIG. 3 shows the effect of titanium nitride coating made according to the present invention on the erosion resistance of titanium airfoils tested in a burner rig at 900°-950° F. with the intentional addition of 6 grams of alumina particulate per minute to simulate service encountered wear. The improvement resulting from the titanium nitride coating is substantial, especially in longer tests.

Thus, according to the present invention, a titanium nitride coating has been described which provides erosion resistance while not reducing fatigue resistance.

Although this invention has been shown and described with respect to detailed embodiments thereof, it will be understood by those skilled in the art that various changes in form and detail thereof may be made without departing from the spirit and scope of the claimed invention.

We claim:

1. An erosion resistant coated titanium article having fatigue properties essentially equal to a similar uncoated titanium article which comprises:
   a titanium article having residual compressive surface stresses;
   a titanium nitride surface coating on said article having residual compressive surface stresses in excess of the preexisting titanium residual compressive surface stress.

2. An article as in claim 1 wherein the titanium article surface stress is 50–100 ksi and the coating residual surface stress is 100–150 ksi.

3. An article as in claim 1 wherein the coating residual surface stress exceeds the titanium article residual surface stress by about 10–40 ksi.

4. An article as in claim 1 wherein the coating is 10–25 microns thick.

5. An article as in claim 1 wherein the ratio of nitrogen to titanium in the titanium nitride surface coating is from about 1.05 to about 1.15.

* * * * *

UNITED STATES PATENT AND TRADEMARK OFFICE
CERTIFICATE OF CORRECTION

PATENT NO. : 4,904,528

DATED : February 27, 1990

INVENTOR(S) : Dinesh K. Gupta and Melvin Freling

It is certified that error appears in the above-identified patent and that said Letters Patent is hereby corrected as shown below:

Column 6, line 47, "25" should be --18--.

Signed and Sealed this

Fourteenth Day of January, 1992

Attest:

HARRY F. MANBECK, JR.

*Attesting Officer*      *Commissioner of Patents and Trademarks*